United States Patent
Streppel et al.

(10) Patent No.: US 9,466,773 B2
(45) Date of Patent: Oct. 11, 2016

(54) SEMICONDUCTOR LIGHT DEVICE INCLUDING A LENS HAVING A LIGHT DEFLECTION STRUCTURE

(75) Inventors: Henrike Streppel, Regensburg (DE); Timon Rupp, Munich (DE)

(73) Assignee: OSRAM GMBH, Munich (DE)

( * ) Notice: Subject to any disclaimer, the term of this patent is extended or adjusted under 35 U.S.C. 154(b) by 107 days.

(21) Appl. No.: 14/351,884

(22) PCT Filed: Sep. 14, 2012

(86) PCT No.: PCT/EP2012/068161
§ 371 (c)(1),
(2), (4) Date: Apr. 15, 2014

(87) PCT Pub. No.: WO2013/056928
PCT Pub. Date: Apr. 25, 2013

(65) Prior Publication Data
US 2014/0239336 A1    Aug. 28, 2014

(30) Foreign Application Priority Data
Oct. 20, 2011    (DE) ........................ 10 2011 084 881

(51) Int. Cl.
| | |
|---|---|
| *F21V 5/00* | (2015.01) |
| *H01L 33/58* | (2010.01) |
| *F21V 5/04* | (2006.01) |
| *F21V 7/00* | (2006.01) |
| *F21V 17/00* | (2006.01) |
| *F21V 17/04* | (2006.01) |

(Continued)

(52) U.S. Cl.
CPC ............... *H01L 33/58* (2013.01); *F21V 5/045* (2013.01); *F21V 7/0091* (2013.01); *F21V 17/002* (2013.01); *F21V 17/04* (2013.01); *F21V 17/12* (2013.01); *F21V 17/164* (2013.01); *F21Y 2101/02* (2013.01)

(58) Field of Classification Search
CPC ........................................................ H01L 33/58
USPC ........................................ 362/327–328, 326
See application file for complete search history.

(56) References Cited

U.S. PATENT DOCUMENTS

| | | | | |
|---|---|---|---|---|
| 5,404,869 A | * | 4/1995 | Parkyn, Jr. ......... | G02B 19/0028 126/698 |
| 5,613,769 A | * | 3/1997 | Parkyn, Jr. ............ | F21V 7/0091 126/698 |

(Continued)

FOREIGN PATENT DOCUMENTS

DE    202007009297 U1    12/2007

OTHER PUBLICATIONS

International Search Report issued in the corresponding PCT application No. PCT/EP2012/068161, dated Nov. 23, 2012.

*Primary Examiner* — Ali Alavi
(74) *Attorney, Agent, or Firm* — Viering, Jentschura & Partner mbB

(57) ABSTRACT

A semiconductor lighting device may include at least one semiconductor light source and a lens, wherein the lens has a light entrance surface at the underside, said light entrance surface facing the at least one semiconductor light source, and a light exit surface at the top side, the light entrance surface has a light deflection structure in the form of a TIR structure, at which entering light can be deflected in the direction of the light exit surface by means of total internal reflection, and the lens is fitted to the semiconductor lighting device in a detachable fashion.

15 Claims, 4 Drawing Sheets

(51) Int. Cl.
  *F21V 17/12*  (2006.01)
  *F21V 17/16*  (2006.01)
  *F21Y 101/02*  (2006.01)

(56) References Cited

U.S. PATENT DOCUMENTS

| | | | | |
|---|---|---|---|---|
| 5,676,453 A | * | 10/1997 | Parkyn, Jr. | G02B 19/0028 362/260 |
| 6,924,943 B2 | * | 8/2005 | Minano | G02B 3/08 359/720 |
| 7,813,055 B2 | * | 10/2010 | Yasumoto | G02B 3/08 359/742 |
| 8,220,975 B2 | * | 7/2012 | Miyashita | F21V 5/04 359/642 |
| 2004/0070855 A1 | * | 4/2004 | Benitez | G02B 19/0061 359/858 |
| 2005/0024746 A1 | * | 2/2005 | Shimura | F21V 5/045 359/742 |
| 2010/0284194 A1 | | 11/2010 | Miyashita et al. | |

* cited by examiner

SEMICONDUCTOR LIGHT DEVICE INCLUDING A LENS HAVING A LIGHT DEFLECTION STRUCTURE

RELATED APPLICATIONS

The present application is a national stage entry according to 35 U.S.C. §371 of PCT application No.: PCT/EP2012/068161 filed on Sep. 14, 2012, which claims priority from German application No.: 10 2011 084 881.9 filed on Oct. 20, 2011, and is incorporated herein by reference in its entirety.

TECHNICAL FIELD

Various embodiments relate to a semiconductor lighting device including at least one semiconductor light source and a lens, wherein the lens has a light entrance surface at the underside, said light entrance surface facing the at least one semiconductor light source, and a light exit surface at the top side, and the light entrance surface has a light deflection structure. Various embodiments also relate to a set including such a semiconductor lighting device and having at least one changeable lens. The embodiment according to the present disclosure is advantageously applicable, in particular, to LED retrofit lamps for combined room lighting and object lighting.

BACKGROUND

Previously existing directional LED lamps including a lens disposed downstream of at least one light-emitting diode generally have a fixed emission angle of the light beam emitted by them. Emission angles of between 10° and 60° are customary in this case. The chosen emission angle typically depends on the application. In this regard, for example, a wide emission is often desired for room lighting, whereas a narrower emission is usually desired for lighting objects.

A halogen lamp retrofit lamp (Bulbrite LED MR-16 Multibeam) exists which has an emission angle adjustable in steps of 15°, 20°, 25°, 30°, 35°, and 40°. In this case, a distance between the light-emitting diode (LED) serving as light source and a lens disposed downstream of the LED is set by means of a mechanism. What is disadvantageous about this concept is the use of a traditional lens having a small diameter, which prevents large collimation strengths in conjunction with a compact design.

An incandescent lamp retrofit lamp (LUMITRONIX XR20 LED Spot) is known which can optionally be equipped with a diffuse or a clear lens. This leads to a softer or sharply delimited light spot, but not to a significant change in the emission angle.

Fresnel lenses are known, having Fresnel rings as a light deflection structure at their light entrance surface, at which rings entering light can be deflected (refractively) in the direction of the light exit surface by means of simple light refraction.

SUMMARY

Various embodiments provide a structurally compact possibility for easily changing a type of lighting of a semiconductor lighting device.

Various embodiments provide a semiconductor lighting device including at least one semiconductor light source and a lens, wherein the lens has a light entrance surface at the underside, said light entrance surface facing the at least one semiconductor light source, and a light exit surface at the top side, the light entrance surface has a light deflection structure in the form of a TIR structure, at which entering light can be deflected in the direction of the light exit surface by means of total internal reflection, and the lens is fitted to the semiconductor lighting device in a detachable fashion.

The TIR structure and total internal reflection associated therewith enables a particularly strong light deflection in a small space, in particular a stronger light deflection than can be achieved with a purely refractive light deflection structure (e.g. on the basis of Fresnel rings or with a simple lens form). As a result, a particularly compact, in particular flat, lens can be provided, which can generate a wide range of emission angles and, in particular, can achieve a high collimation strength. This in turn enables use both for room lighting (with relatively large emission angles) and for object lighting (with relatively small emission angles), to be precise also under particularly confined spatial conditions such as are present in the case of retrofit lamps, for example. The at least one semiconductor lighting device is therefore configured and arranged, in particular, such that light beams which emerge therefrom and which impinge on the TIR structure are at least substantially deflected by total internal reflection to or in the direction of the light exit surface.

By virtue of the fact that the lens is fitted to the semiconductor lighting device in a detachable fashion, the lens can be exchanged for another lens ("changeable lens"), in particular likewise of the type described above, but in particular with a different emission angle (changeable lens system), which affords a flexible, material-saving and inexpensive possibility of adapting the semiconductor lighting device to different types of lighting (room lighting, object lighting, etc.).

In one configuration, the TIR structure at least substantially completely covers the light entrance surface. This enables a particularly high collimation strength.

In one configuration, the TIR structure covers an outer (typically in relation to its longitudinal axis, which usually also constitutes an axis of symmetry), ring-shaped region of the light entrance surface. A TIR structure has the highest effect there since it can deflect light beams proceeding highly angularly from the longitudinal axis effectively in the direction of the longitudinal axis. By contrast, in an inner region surrounded by the TIR structure (which inner region typically encompasses the longitudinal axis and the light entrance surface of which inner region is irradiated by light beams with a comparatively small angle with respect to the longitudinal axis), a TIR structure will enable only a slight improvement in conjunction with an increased modeling and production outlay and in most cases will not actually be required, since a light deflection for light collimation there usually need not be large or is even not required.

In another configuration, the inner region of the light entrance surface, said inner region being surrounded by the TIR structure, is a refractively light-deflecting region. This region is easy to produce and sufficient in most cases for permitting a required (small) light deflection. The refractively light-deflecting region can be embodied in particular in a lens-shaped fashion (e.g. in a convex fashion). The lens-shaped region can be configured, for example, analogously to one lens or to a plurality of lenses (in particular lens array). The lens-shaped region can also have one or a plurality of pillow-like structures ("pillows") and/or Fresnel structures (e.g. Fresnel rings).

In yet another configuration, an inner region of the light entrance surface, said inner region being surrounded by the TIR structure, is an optically inactive region. Such an optically inactive region can be configured particularly easily, e.g. by means of a plane surface. This makes use of the fact that a light beam incident in the optically inactive region, upon passing through the light entrance surface, typically need only be deflected insignificantly and nevertheless does not, or not significantly, increase the emission angle.

In a further configuration, the TIR structure is formed in cross section by at least one series of (in particular toothlike) projections. The latter have the advantage that they can particularly effectively deflect light beams from a light source that are emitted in particular highly obliquely or angularly with respect to a longitudinal axis of the lens in a confined space, that is to say in particular such light beams which otherwise generate a wide light cone or a large emission angle. A particularly flat design can be achieved by means of the plurality of projections.

The series of projections can correspond, in particular, to a group of ring-like projections which, in particular, do not overlap (that is to say are arranged in a manner nested in one another). This affords the advantage that a high collimation strength can be maintained over the entire circumferential direction of the emitted light beam. The ring-like projections can be arranged, in particular, concentrically (e.g. with respect to a longitudinal axis of the lens) with respect to one another.

The ring-like projections can have e.g. an annular basic shape, which enables a rotationally symmetrical light emission, or an angular, e.g. square, basic shape, which still enables an at least rotationally symmetrical light emission under specific angles of symmetry.

The shape of the cross-sectionally tooth-like projections is triangular, in particular, which enables a high collimation strength in conjunction with simple production. In this regard, such a TIR structure can be produced without an undercut and can thus be produced easily e.g. by means of a molding method (e.g. by means of an injection-molding method, e.g. made from plastic or glass).

The two free sides of a triangular projection (which by its third side is connected to the rest of the lens) can be shaped arbitrarily in principle. In this regard, one or both free sides can be (in cross section) rectilinear and/or curved, wherein a shape that is rectilinear on both sides can be modeled and produced particularly easily.

The projections in the series of projections can have an identical basic shape and size. Alternatively, at least two of the projections, in particular all of the projections, can have a mutually different basic shape and/or size. This enables a particularly well defined and effective light deflection. By way of example, at least two of the projections can have rectilinear free sides which, however, form a different angle with one another, that is to say are narrower or wider.

In one configuration, moreover, at least some of the projections are height-offset with respect to one another and/or have a different height.

In one development, at least some of the projections are fashioned more deeply and/or project more deeply from the inside toward the outside (in particular in relation to a radial distance from the longitudinal axis).

In an alternative or additional development, at least some of the projections are fashioned more deeply and/or project more deeply from the outside toward the inside (in particular in relation to a radial distance from the longitudinal axis).

As a result of the height offset and/or the longer extent or deeper ending of the projections, an effective collimation of light incident on the light entrance surface in a large solid angle range is made possible in a compact manner.

By virtue of the fact that at least some of the projections are fashioned more deeply from the inside (in particular arranged nearer the longitudinal axis) toward the outside (in particular arranged further away from the longitudinal axis) (that is to say that projections situated further toward the outside are fashioned more deeply than inner projections with respect thereto), it is possible to cover a high solid angle range with the TIR structure, in particular a range with a high angle of the incident light relative to an axis of symmetry of the semiconductor light source. This applies analogously to a height or length of the projections that increases from the inside toward the outside.

By virtue of the fact that at least some of the projections are fashioned more deeply from the outside toward the inside (that is say that projections situated further toward the inside are fashioned more deeply than outside projections with respect thereto), it is possible to realize a strong deflection even at an inner region of the TIR structure (in particular even in proximity to the longitudinal axis). This analogously applies to a height or length of the projections that increases from the outside toward the inside.

In one development, the light exit surface has one or a plurality of optical or optically active regions, e.g. at least one lens-like region, for example an array including a plurality of lenses, in particular microscopically small lenses ("microlens array").

The at least one semiconductor lighting device may include one or a plurality of semiconductor light sources. Preferably, the at least one semiconductor light source includes at least one light-emitting diode. In the case where a plurality of light-emitting diodes are present, they can emit light in the same color or in different colors. A color may be monochromatic (e.g. red, green, blue, etc.) or multichromatic (e.g. white). The light emitted by the at least one light-emitting diode can also be infrared light (IR LED) or ultraviolet light (UV LED). A plurality of light-emitting diodes can generate mixed light; e.g. white mixed light. The at least one light-emitting diode can contain at least one wavelength-converting phosphor (conversion LED). Alternatively or additionally, the phosphor can be arranged in a manner remote from the light-emitting diode ("remote phosphor"). The at least on light-emitting diode can be present in the form of at least one individually packaged light-emitting diode or in the form of at least one LED chip. A plurality of LED chips can be mounted on a common substrate ("submount"). The at least one light-emitting diode can be equipped with at least one dedicated and/or common optical unit for beam guiding, e.g. at least one Fresnel lens, collimator, and so on. Instead of or in addition to inorganic light-emitting diodes, e.g. on the basis of InGaN or AlInGaP generally organic LEDs (OLEDs, e.g. polymer OLEDs) may also be used. Alternatively, the at least one semiconductor light source may include e.g. at least one diode laser.

In one development, the at least one semiconductor light source and the lens are arranged at least substantially concentrically with respect to one another, which enables a symmetrical light emission, in particular about a longitudinal axis of the lens and thus also of the semiconductor light source(s).

In one configuration, the semiconductor lighting device is a retrofit lamp. A semiconductor retrofit lamp is, in particular, a lamp including semiconductor light sources which is provided and designed for replacing a conventional lamp (incandescent lamp, halogen lamp, etc.). In particular in the case of a semiconductor retrofit lamp, the associated compliance with the outer contour of the lamp to be replaced is a problem, since a semiconductor retrofit lamp typically requires a large heat sink for dissipating its waste heat and, consequently, allows only very restricted space for a lens, which in turn keeps a light deflection small. In particular with the lens described above, a semiconductor retrofit lamp with simple means and with a small structural space for the lens can achieve a high degree of collimation.

The retrofit lamp can be, in particular, an incandescent lamp retrofit lamp or a halogen lamp retrofit lamp.

Various embodiments further provide a set including such a semiconductor lighting device, in particular lamp, in which a lens is fitted to the lighting device in a detachable fashion, and including at least one further lens ("changeable lens"), wherein the lenses (that is to say the lenses which can be fitted to the lighting device) differ functionally substantially in producing a different emission angle. By this means, too, a flexible, material-saving and inexpensive possibility is provided for adapting the semiconductor lighting device to different types of lighting (room lighting, object lighting etc.), to be precise initially independently of the concrete construction of the lens used.

The set can be present for example as a jointly or separately available product. In the case of the product, such a lens can already be mounted on the lighting device and a changeable lens can be provided in accompaniment or all lenses are provided in accompaniment as lenses that are still to be fitted.

In one configuration, the semiconductor lighting device is a semiconductor lighting device as described above and includes in particular at least one, in particular at least two, lenses as described above having a different emission angle, in particular of approximately 30° and approximately 60°. As a result, an end user can also adapt the type of lighting, in particular the emission angle, in a simple manner.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the disclosed embodiments. In the following description, various embodiments described with reference to the following drawings, in which.

DETAILED DESCRIPTION

The following detailed description refers to the accompanying drawing that show, by way of illustration, specific details and embodiments in which the disclosure may be practiced.

Figure 1:
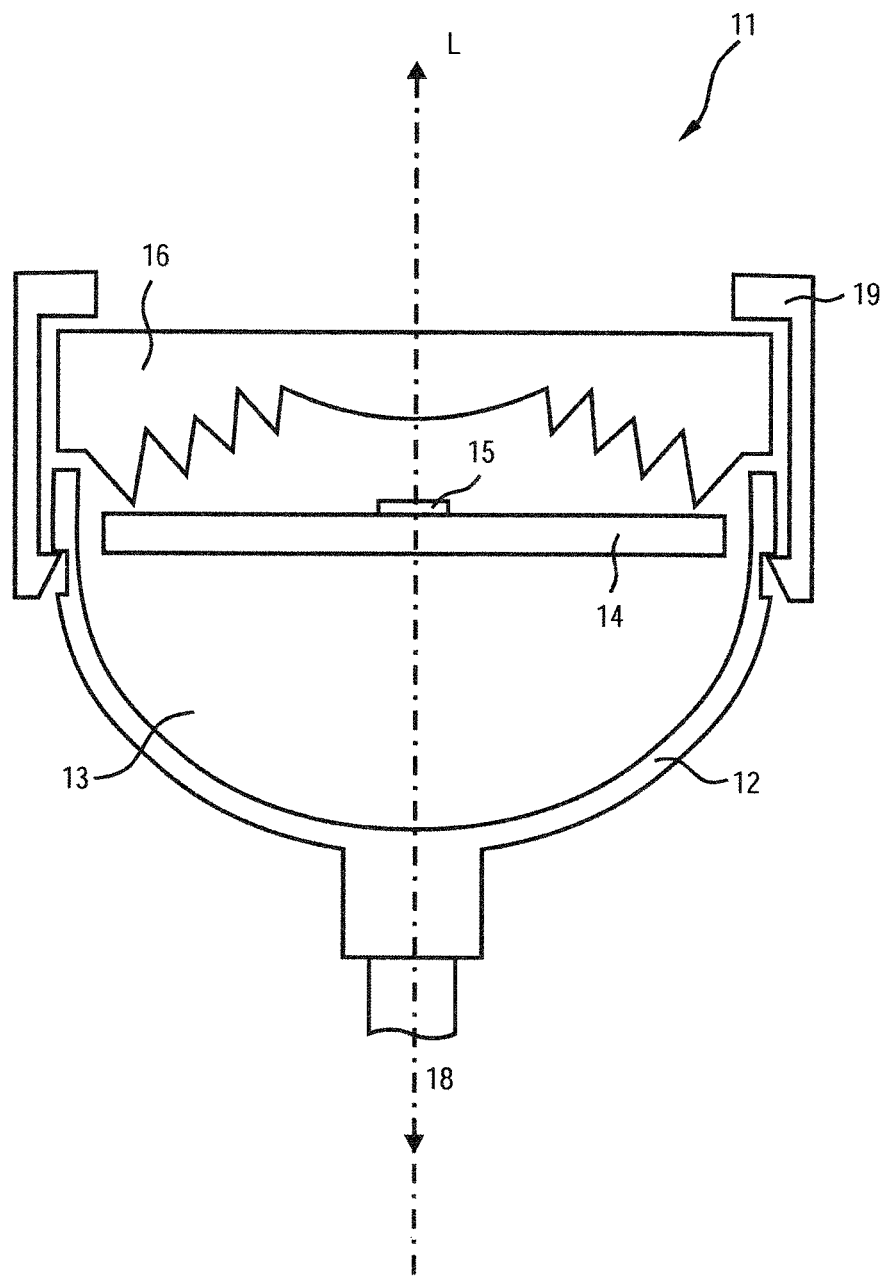
FIG. 1 shows as a sectional illustration in side view a semiconductor retrofit lamp in accordance with a first embodiment.

FIG. 1 shows as a sectional illustration in side view a semiconductor retrofit lamp 11 in accordance with a first embodiment. The semiconductor retrofit lamp 11 has a housing body 12, which is simultaneously configured as a heat sink and has a receptacle space 13 for receiving a driver (not illustrated). The semiconductor retrofit lamp 11 furthermore has a substrate 14 (e.g. a printed circuit board) with a semiconductor light source—arranged on the front side—in the form of one or more light-emitting diodes, only one light-emitting diode 15 of which is depicted here purely by way of example. The light-emitting diode 15 emits light toward the front (into an upper half-space) and in this case is covered by a transparent lens 16 (as a simplified designation for a general optical element).

At its rear side 17, the housing body 12 has a base 18 for connection to a conventional holder (not illustrated), wherein the base 18 is electrically connected to the driver and the driver drives the light-emitting diode 15.

The lens 16 is fixed to the semiconductor retrofit lamp 11, in particular to the housing body 12, in an exchangeable fashion by virtue of said lens being fixed thereto by means of a releasable latching connection in the form of a snap-action ring 19. By releasing the snap-action ring 19, it is possible for the lens 16 to be exposed and exchanged.

Figure 2:
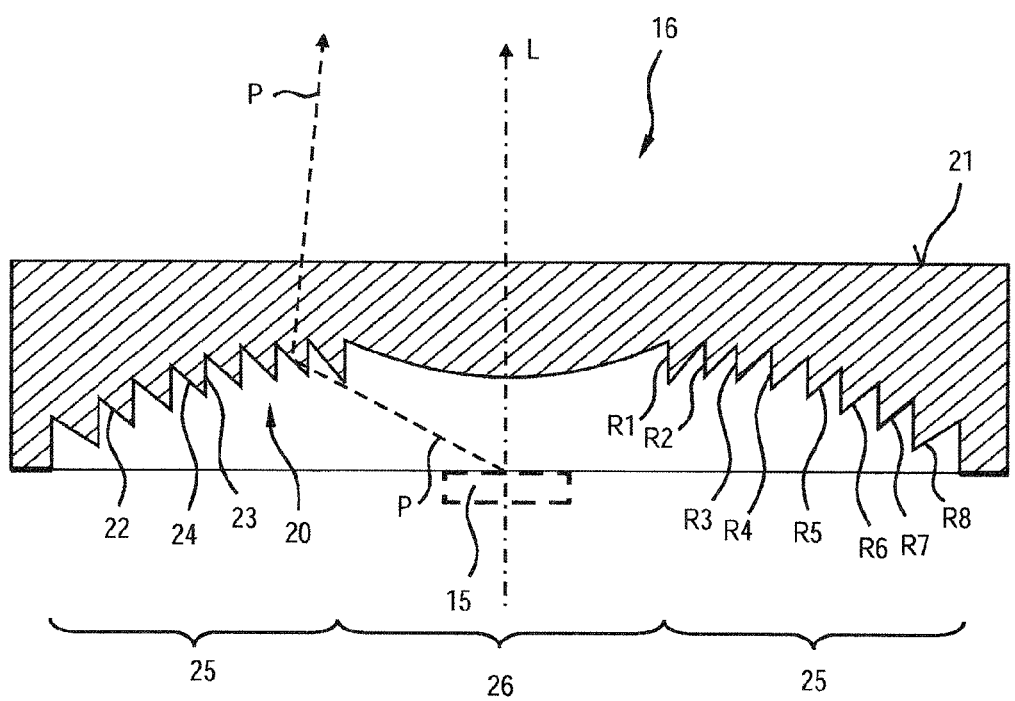
FIG. 2 shows as a sectional illustration in side view a lens of the semiconductor retrofit lamp in accordance with the first embodiment.

As also shown in greater detail in FIG. 2 the lens 16 has a light entrance surface 20 at the underside, said light entrance surface facing the light-emitting diode 15, and a light exit surface 21 at the top side. The light entrance surface 20 has a TIR structure 22, at which a light beam P emitted by the light-emitting diode 15 (as light entering into the light entrance surface 20) is deflected in the direction of the light exit surface 21 by means of total internal reflection. For this purpose, the TIR structure 22 includes a plurality (here eight) of rings R1 to R8 arranged concentrically around a longitudinal axis L of the lens 16. As a result, the TIR structure 22 has in cross section on each side of the longitudinal axis L a series of tooth-like projections R1 to R8 corresponding to the rings R1 to R8.

The longitudinal axis L also constitutes an axis of symmetry and optical axis of the lens 16 and additionally corresponds to an axis of symmetry and also a main emission direction of the light-emitting diode 15.

The rings or projections R1 to R8 are each embodied in a triangular fashion in cross section and have two free straight sides 23, 24. The inner free side 23 directed toward the longitudinal axis L is substantially perpendicular, or parallel to the longitudinal axis L, preferably with a small mold release bevel, while the outer free side 24 facing away from the longitudinal axis L is inclined. This TIR structure 22 does not have an undercut and can therefore be produced by means of a simple mold, for example by means of a molding method, in particular injection-molding method.

With increasing distance from the longitudinal axis L, the projections R2 to R8 project more deeply downward (counter to the direction of the longitudinal axis L, since they are fashioned correspondingly more deeply and/or have a larger height) and can thus cover a wide solid angle range with a high angle with respect to the longitudinal axis L, without mutually shading one another.

The projection R1, which is nearer the longitudinal axis L than the other projections R2 to R8, has a higher height than the next projection R2 and projects further downward than the projection R2. This ensures that even a light beam which is radiated up to the TIR structure 22 at a small angle with respect to the longitudinal axis L is deflected by means of total internal reflection. Consequently the TIR structure 22 is configured such that an overwhelming majority of the light beams impinge on an inner free side 23 and the light beams are deflected in this case such that they then also impinge on the totally reflecting outer free side 24.

The mode of action of total internal reflection is shown with the aid of the light beam P in FIG. 2. Here for example proceeding from a point on the longitudinal axis L, the light beam P impinges from the outside on the inner free side 23 of the ring or projection R2 and from there passes with slight refraction to the inclined outer free side 24. The angle of the inclined side 24 is designed such that the light beam P passing within the projection R2 is subjected to total internal reflection upon impinging on the inclined side 24, the light beam P specifically being deflected more strongly in the direction of the longitudinal axis. As a result, an emission angle (with respect to the longitudinal axis L) is reduced, specifically by means of a very compact, in particular very flat, lens 16.

The lens 16 can be embodied in particular as rotationally symmetrical about the longitudinal axis, in particular with a circular basic shape, or as rotationally symmetrical with a symmetry about specific angles of rotation, e.g. square, hexagonal or octagonal, etc. The fact that the TIR structure 22 covers an outer, ring-shaped (in particular annular) region 25 of the light entrance surface 20 can therefore mean, in particular, that an inner region 26 encompassing the longitudinal axis L has no TIR structure. Rather, the inner region 26 of the lens 16 at the light entrance surface 20 has a refractively light-deflecting, convex lens shape which suffices to ensure that the light beams of the light-emitting diode 15 which are incident on it, said light beams exhibiting there a comparatively small emission angle or being angled only comparatively slightly relative to the longitudinal axis L, are deflected sufficiently in the direction of the longitudinal axis L.

By means of a variation of the lens 16, for example with regard to an inclination of the free sides 24, a number, spacing, shape and/or height of the rings or projections R1 to R8, etc., it is possible to set the emission angle precisely, e.g. to 30° or 60°.

Figure 3:
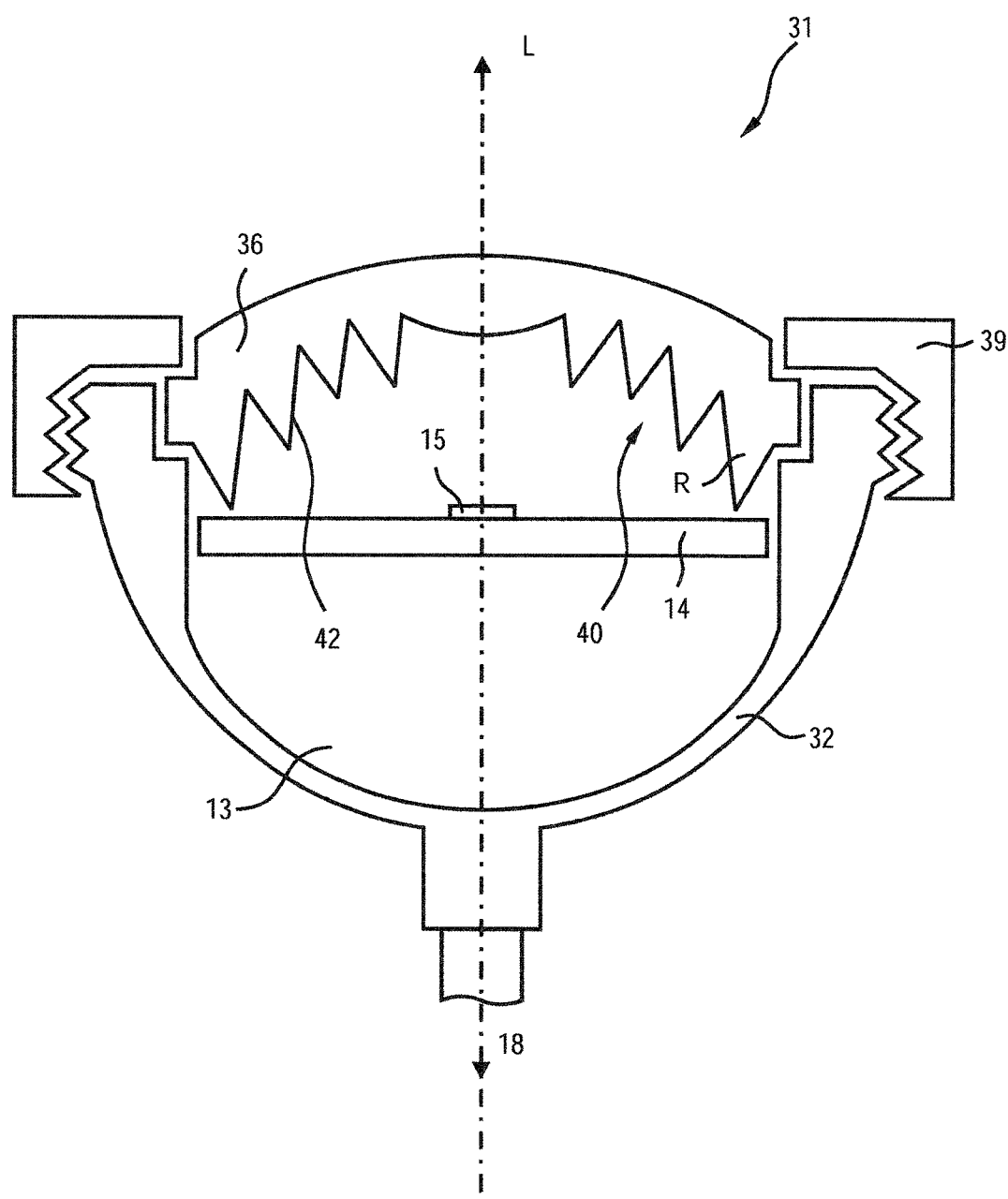
FIG. 3 shows as a sectional illustration in side view a semiconductor retrofit lamp in accordance with a second embodiment.

FIG. 3 shows as a sectional illustration in side view a semiconductor retrofit lamp 31 in accordance with a second embodiment. The semiconductor retrofit lamp 31 is constructed similarly to the semiconductor retrofit lamp 11, but now has a different lens 36 and a different releasable latching connection in the form of a screw ring 39.

The lens 36 has a basic shape curved like a spherical cap, such that the light exit surface 41 thereof is likewise curved like a spherical cap. The light entrance surface 40 likewise has a TIR structure 42 and a convex inner region 26, but the projections R of the TIR structure 42 are height-offset to a greater extent with respect to one another such that the TIR structure 42 is also higher than the TIR structure 22.

The screw ring 39 holds the lens 36 in the housing body 32 preferably in a press fit. The screw ring 39 can be screwed onto an outer side of the housing body 32 and can be unscrewed therefrom again, in order to enable the lens to be changed, e.g. for exchange with the lens 16.

Figure 4:
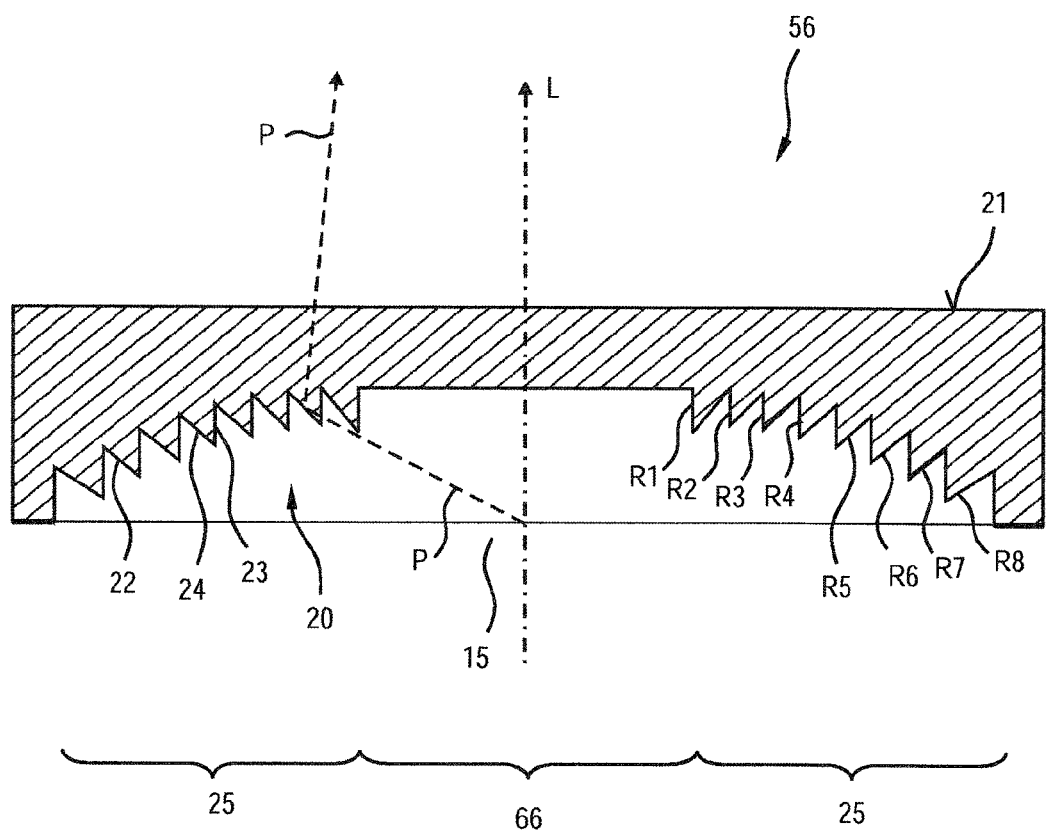
FIG. 4 shows as a sectional illustration in side view a further lens for a semiconductor retrofit lamp, e.g. in accordance with the first embodiment.

FIG. 4 shows as a sectional illustration in side view a further lens 56 for a semiconductor retrofit lamp, e.g. for a semiconductor retrofit lamp 11 or 31.

The lens 56 is constructed similarly to the lens 16, except that now the inner region 66 of the lens 56 does not have a dedicated optical effect, but rather is configured as a planar region. This enables particularly simple production and utilizes the fat that an inner region 66 of the light entrance surface 50 which is small enough does not increase the emission angle.

The lens can consist of plastic, glass or ceramic, for example.

Moreover, the light exit surface 21 can be embodied as optically active, e.g. can be shaped in a lens-shaped fashion concavely or convexly at least regionally and/or can be provided with at least one optically active structure, e.g. a further TIR structure, Fresnel structure, microlenses, etc.

While the disclosed embodiments have been particularly shown and described with reference to specific embodiments, it should be understood by those skilled in the art that various changes in form and detail may be made therein without departing from the spirit and scope of the disclosed embodiments as defined by the appended claims. The scope of the disclosed embodiments is thus indicated by the appended claims and all changes which come within the meaning and range of equivalency of the claims are therefore intended to be embraced.

LIST OF REFERENCE SIGNS

11 Semiconductor retrofit lamp
12 Housing body
13 Receptacle space
14 Substrate
15 Light-emitting diode
16 Lens
17 Rear side
18 Base
19 Snap-action ring
20 Light entrance surface at the underside
21 Light exit surface at the top side
22 TIR structure
23 Straight side
24 Inclined side
25 Ring-shaped region
26 Inner region
31 Semiconductor retrofit lamp
32 Housing body
36 Lens
39 Screw ring
41 Light exit surface
42 TIR structure
50 Light entrance surface
56 Lens
66 Inner region
L Longitudinal axis
P Light beam
R1 Ring/projection
R2 Ring/projection
R3 Ring/projection
R4 Ring/projection
R5 Ring/projection
R6 Ring/projection
R7 Ring/projection
R8 Ring/projection

The invention claimed is:

1. A semiconductor lighting device comprising at least one semiconductor light source and a lens, wherein
  the lens has a light entrance surface at the underside, said light entrance surface facing the at least one semiconductor light source, and a light exit surface at the top side,
  the light entrance surface has a light deflection structure in the form of a TIR structure, at which entering light can be deflected in the direction of the light exit surface by means of total internal reflection, and
  the lens is fitted to the semiconductor lighting device in a detachable fashion.

2. The semiconductor lighting device as claimed in claim 1, wherein the TIR structure at least substantially completely covers the light entrance surface.

3. The semiconductor lighting device as claimed in claim 1, wherein the TIR structure covers an outer, ring-shaped region of the light entrance surface.

4. The semiconductor lighting device as claimed in claim 3, wherein an inner region of the light entrance surface, said inner region being surrounded by the TIR structure, is a refractively light-deflecting region.

5. The semiconductor lighting device as claimed in claim 3, wherein an inner region of the light entrance surface, said inner region being surrounded by the TIR structure, is an optically inactive region.

6. The semiconductor lighting device as claimed in claim 1, wherein the TIR structure is formed in cross section by at least one series of tooth-like projections.

7. The semiconductor lighting device as claimed in claim 6, wherein at least some of the projections are height-offset with respect to one another and/or have a different height.

8. The semiconductor lighting device as claimed in claim 7, wherein the at least some of the projections are fashioned more deeply and/or project more deeply from the inside toward the outside.

9. The semiconductor lighting device as claimed in claim 7, wherein the at least some of the projections are fashioned more deeply and/or project more deeply from the outside toward the inside.

10. The semiconductor lighting device as claimed in claim 1, wherein the semiconductor lighting device is a lamp.

11. The semiconductor lighting device as claimed in claim 1, wherein the light exit surface has one or a plurality of optically active regions.

12. A set comprising a semiconductor lighting device and at least one changeable lens,
the semiconductor lighting device comprising:
at least one semiconductor light source and a lens, wherein
the lens has a light entrance surface at the underside, said light entrance surface
facing the at least one semiconductor light source, and a light exit surface at the top side,
the light entrance surface has a light deflection structure in the form of a TIR structure, at which entering light can be deflected in the direction of the light exit surface by means of total internal reflection, and
the lens is fitted to the semiconductor lighting device in a detachable fashion,
wherein the lenses differ functionally substantially in producing a different emission angle.

13. The set as claimed in claim 12, wherein one of the lenses has an emission angle of approximately 30° and another of the lenses has an emission angle of approximately 60°.

14. The semiconductor lighting device as claimed in claim 8, wherein the at least some of the projections are fashioned more deeply and/or project more deeply from the outside toward the inside.

15. The semiconductor lighting device as claimed in claim 1, wherein the semiconductor lighting device is a retrofit lamp.

* * * * *